(12) United States Patent
Maricevic et al.

(10) Patent No.: US 11,870,403 B2
(45) Date of Patent: Jan. 9, 2024

(54) HALF DUPLEX AMPLIFIER

(71) Applicant: ARRIS Enterprises LLC, Suwanee, GA (US)

(72) Inventors: Zoran Maricevic, West Hartford, CT (US); Marcel F. C. Schemmann, Waldfeuchterbaan (NL); Zhijian Sun, Avon, CT (US); Shodhan K. Shetty, Farmington, CT (US); Dean Painchaud, Cromwell, CT (US); Brian J. Solomon, Middlefield, CT (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/953,176

(22) Filed: Sep. 26, 2022

(65) Prior Publication Data
US 2023/0098958 A1 Mar. 30, 2023

Related U.S. Application Data

(60) Provisional application No. 63/248,256, filed on Sep. 24, 2021.

(51) Int. Cl.
*H03F 3/68* (2006.01)
*H03G 3/00* (2006.01)
*H03F 1/12* (2006.01)

(52) U.S. Cl.
CPC .............. *H03G 3/005* (2013.01); *H03F 1/12* (2013.01); *H03F 2200/165* (2013.01); *H03F 2200/171* (2013.01); *H03F 2200/63* (2013.01)

(58) Field of Classification Search
CPC ..... H03G 3/005; H03F 1/12; H03F 2200/165; H03F 2200/171; H03F 2200/63; H03F 3/62; H04B 10/25751; H04B 1/10; H04B 3/02; H04B 1/123; H04B 1/12; H04B 10/299; H04B 10/2589; H04B 1/0475; H04B 10/2507; H04H 20/78; H04N 7/102; H04N 21/2408; H04N 21/238; H04N 21/2385; H04N 21/2221; H04N 21/6473; H04N 21/6338; H04N 21/6168; H04N 21/435; H04N 21/4621
See application file for complete search history.

(56) References Cited

U.S. PATENT DOCUMENTS 9,209,898 B1 * 12/2015 Schemmann ...... H04N 21/2408
11,616,632 B2 * 3/2023 Bowler ..................... H03F 3/62
370/276
2017/0019146 A1 1/2017 Jin et al.
(Continued)

FOREIGN PATENT DOCUMENTS

WO 20130126298 8/2013

OTHER PUBLICATIONS

Coomans Werner et al: "Full Duplex DOCSIS over Active (N+X) Cable Networks", SCTE-ISBE, Cable-Tec, 2019 Expo, Oct. 3, 2019, pp. 1-23, XP055858065, Retrieved from the Internet: URL:https:// www.nctatechnicalpapers.com/Paper/2019/2019-full-duplex-docsis-ocer-active-n-x-cable-networks/download [retrieved on Nov. 4, 2021] the whole document.
(Continued)

*Primary Examiner* — Khanh V Nguyen
(74) *Attorney, Agent, or Firm* — Chernoff, Vilhauer, McClung & Stenzel, LLP

(57) ABSTRACT

A half duplex amplifier for a cable network.

6 Claims, 15 Drawing Sheets

(56) References Cited

U.S. PATENT DOCUMENTS

2019/0313132 A1   10/2019  Schemmann et al.
2020/0313705 A1   10/2020  Jin
2021/0167936 A1    6/2021  Bowler

OTHER PUBLICATIONS

International Search Report and Written Opinion Re: Application No. PCT/US2022/044751, dated Jan. 25, 2023.

* cited by examiner

US 11,870,403 B2

HALF DUPLEX AMPLIFIER

CROSS REFERENCE TO RELATED APPLICATIONS

The present application is a continuation of U.S. Patent Application No. 63/248,256 filed on Sep. 24, 2021, the contents of which are incorporated by reference herein.

BACKGROUND

The subject matter of this application relates to amplifiers, and especially amplifiers suitable for a cable network.

Cable Television (CATV) services provide content to large groups of customers (e.g., subscribers) from a central delivery unit, generally referred to as a "head end," which distributes channels of content to its customers from this central delivery unit through an access network comprising a hybrid fiber coax (HFC) cable plant, including associated components (nodes, amplifiers and taps). Modern Cable Television (CATV) service networks, however, not only provide media content such as television channels and music channels to a customer, but also provide a host of digital communication services such as Internet Service, Video-on-Demand, telephone service such as VoIP, home automation/security, and so forth. These digital communication services, in turn, require not only communication in a downstream direction from the head end, through the HFC, typically forming a branch network and to a customer, but also require communication in an upstream direction from a customer to the head end typically through the HFC network.

To this end, CATV head ends have historically included a separate Cable Modem Termination System (CMTS), used to provide high speed data services, such as cable Internet, Voice over Internet Protocol, etc. to cable customers and a video headend system, used to provide video services, such as broadcast video and video on demand (VOD). Typically, a CMTS will include both Ethernet interfaces (or other more traditional high-speed data interfaces) as well as radio frequency (RF) interfaces so that traffic coming from the Internet can be routed (or bridged) through the Ethernet interface, through the CMTS, and then onto the RF interfaces that are connected to the cable company's hybrid fiber coax (HFC) system. Downstream traffic is delivered from the CMTS to a cable modem and/or set top box in a customer's home, while upstream traffic is delivered from a cable modem and/or set top box in a customer's home to the CMTS. The Video Headend System similarly provides video to either a set-top, TV with a video decryption card, or other device capable of demodulating and decrypting the incoming encrypted video services. Many modern CATV systems have combined the functionality of the CMTS with the video delivery system (e.g., EdgeQAM—quadrature amplitude modulation) in a single platform generally referred to an Integrated CMTS (e.g., Integrated Converged Cable Access Platform (CCAP))—video services are prepared and provided to the I-CCAP which then QAM modulates the video onto the appropriate frequencies. Still other modern CATV systems generally referred to as distributed CMTS (e.g., distributed Converged Cable Access Platform) may include a Remote PHY (or R-PHY) which relocates the physical layer (PHY) of a traditional Integrated CCAP by pushing it to the network's fiber nodes (R-MAC PHY relocates both the MAC and the PHY to the network's nodes). Thus, while the core in the CCAP performs the higher layer processing, the R-PHY device in the remote node converts the downstream data sent from the core from digital-to-analog to be transmitted on radio frequency to the cable modems and/or set top boxes, and converts the upstream radio frequency data sent from the cable modems and/or set top boxes from analog-to-digital format to be transmitted optically to the core.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
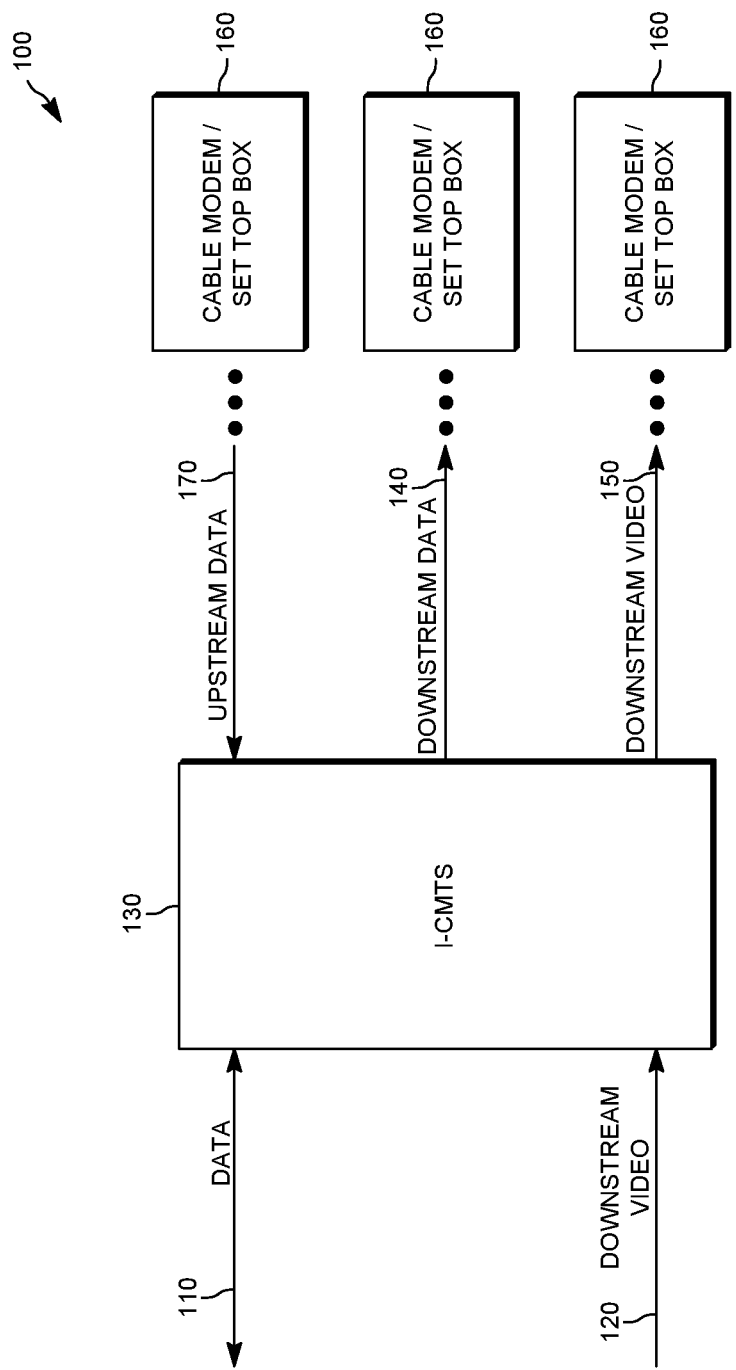
FIG. 1 illustrates an integrated Cable Modem Termination System.

Referring to FIG. 1, an integrated CMTS (e.g., Integrated Converged Cable Access Platform (CCAP)) 100 may include data 110 that is sent and received over the Internet (or other network) typically in the form of packetized data. The integrated CMTS 100 may also receive downstream video 120, typically in the form of packetized data from an operator video aggregation system. By way of example, broadcast video is typically obtained from a satellite delivery system and pre-processed for delivery to the subscriber though the CCAP or video headend system. The integrated CMTS 100 receives and processes the received data 110 and downstream video 120. The CMTS 130 may transmit downstream data 140 and downstream video 150 to a customer's cable modem and/or set top box160 through a RF distribution network, which may include other devices, such as amplifiers and splitters, typically at least in part over co-axial cables. The CMTS 130 may receive upstream data 170 from a customer's cable modem and/or set top box160 through a network, which may include other devices, such as amplifiers and splitters. The CMTS 130 may include multiple devices to achieve its desired capabilities.

Figure 2:
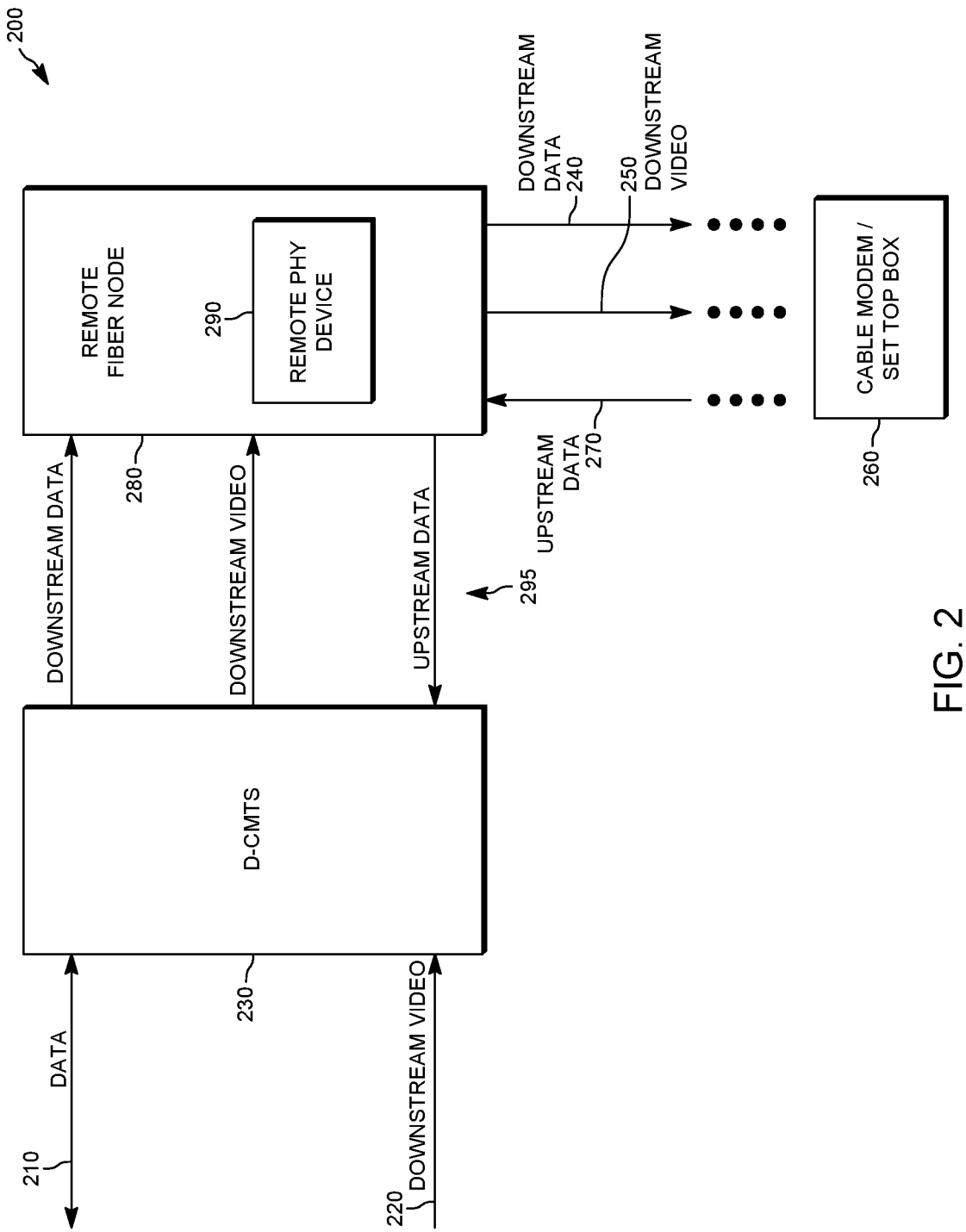
FIG. 2 illustrates a distributed Cable Modem Termination System.

Referring to FIG. 2, as a result of increasing bandwidth demands, limited facility space for integrated CMTSs, and power consumption considerations, it may be desirable to include a Distributed Cable Modem Termination System (D-CMTS) 200 (e.g., Distributed Converged Cable Access Platform (CCAP)). In general, the CMTS is focused on data services while the CCAP further includes broadcast video services. The D-CMTS 200 distributes a portion of the functionality of the I-CMTS 100 downstream to a remote location, such as a fiber node, using network packetized data. An exemplary D-CMTS 200 may include a remote PHY architecture, where a remote PHY (R-PHY) is preferably an optical node device that is located at the junction of the fiber and the coaxial. In general the R-PHY often includes the PHY layers of a portion of the system. The D-CMTS 200 may include a D-CMTS 230 (e.g., core) that includes data 210 that is sent and received over the Internet (or other network) typically in the form of packetized data. The D-CMTS 200 may also receive downstream video 220, typically in the form of packetized data from an operator video aggregation system. The D-CMTS 230 receives and processes the received data 210 and downstream video 220. A remote Fiber node 280 preferably includes a remote PHY device 290. The remote PHY device 290 may transmit downstream data 240 and downstream video 250 to a customer's cable modem and/or set top box 260 through a network, which may include other devices, such as amplifier and splitters. The remote PHY device 290 may receive upstream data 270 from a customer's cable modem and/or set top box 260 through a network, which may include other devices, such as amplifiers and splitters, typically at least in part over co-axial cables. The remote PHY device 290 may include multiple devices to achieve its desired capabilities. The remote PHY device 290 primarily includes PHY related circuitry, such as downstream QAM modulators, upstream QAM demodulators, together with pseudowire logic to connect to the D-CMTS 230 using network packetized data. The remote PHY device 290 and the D-CMTS 230 may include data and/or video interconnections, such as downstream data, downstream video, and upstream data 295. It is noted that, in some embodiments, video traffic may go directly to the remote physical device thereby bypassing the D-CMTS 230. In some cases, the remote PHY and/or remote MAC PHY functionality may be provided at the head end.

By way of example, the remote PHY device 290 may covert downstream DOCSIS (i.e., Data Over Cable Service Interface Specification) data (e.g., DOCSIS 1.0; 1.1; 2.0; 3.0; 3.1; and 4.0 each of which are incorporated herein by reference in their entirety), video data, out of band signals received from the D-CMTS 230 to analog for transmission over RF or analog optics. By way of example, the remote PHY device 290 may convert upstream DOCSIS, and out of band signals received from an analog medium, such as RF or linear optics, to digital for transmission to the D-CMTS 230. As it may be observed, depending on the particular configuration, the R-PHY may move all or a portion of the DOCSIS MAC and/or PHY layers down to the fiber node.

The cable network includes one or more amplifiers, often in the form of chains of amplifiers, included at various positions within the network in order to boost the signals from the head end to the respective customers, or otherwise boost the signals from the respective customers to the head end, typically at least in part over co-axial cables. In a traditional network frequency division duplex (FDD) for cable systems, fixed frequency bands are allocated for upstream traffic, such as 5-42 MHz, and for downstream traffic, such as 54-862 MHz. As it may be observed, the frequency ranges for the upstream traffic and the downstream traffic are non-overlapping with one another. This enables the amplifier architecture to amplify a range of frequencies for the upstream traffic and a different range of frequencies for the downstream traffic, which simplifies the amplifier architecture.

In order to enable more flexibility in the bandwidth allocation and make more use of the available bandwidth, upgraded cable networks permit a portion (or all) of the upstream frequency range and the downstream frequency range to be overlapping with one another. To accommodate such overlapping frequency ranges in cable networks, each of the amplifiers could be full duplex over at least a portion of their operational frequency range, namely, the overlapping portion(s) of the upstream frequency range and the downstream frequency range. Enabling full duplex amplifiers for a cable network tends to be complicated and relatively expensive.

To accommodate the data transmission requirements of a cable networking system, it was determined based upon traffic analysis that within each amplifier there is no need for simultaneous operation of the same frequency range both in the upstream direction and in the downstream direction. Accordingly, a full duplex amplifier and the associated complexities associated therewith, are not necessary for a cable network. In contrast to a full duplex amplifier, the upstream traffic and the downstream traffic of a modified amplifier for the cable networking system at any particular time preferably takes place at different frequency bands. Further, in contrast to a full duplex amplifier with the upstream traffic and the downstream traffic having simultaneous transmission of the same frequency ranges, it is desirable that the modified amplifier permits the overlapping frequency range(s) to be re-allocated to the downstream traffic or to the upstream traffic, to accommodate the bandwidth desired for the network traffic at any particular time. Accordingly, at any particular frequency at any particular time, the modified amplifier is operating as a half-duplex amplifier.

An amplifier switching between upstream frequency band(s) and downstream frequency band(s) with traditional analog circuitry requires a substantial set of radio frequency filters with associated crossover bands that can be switched in and out. The crossover bands lead to a significant loss of usable spectrum, with the resulting implementation tending to be complicated when a significant number of frequency bands are addressed.

Figure 3:
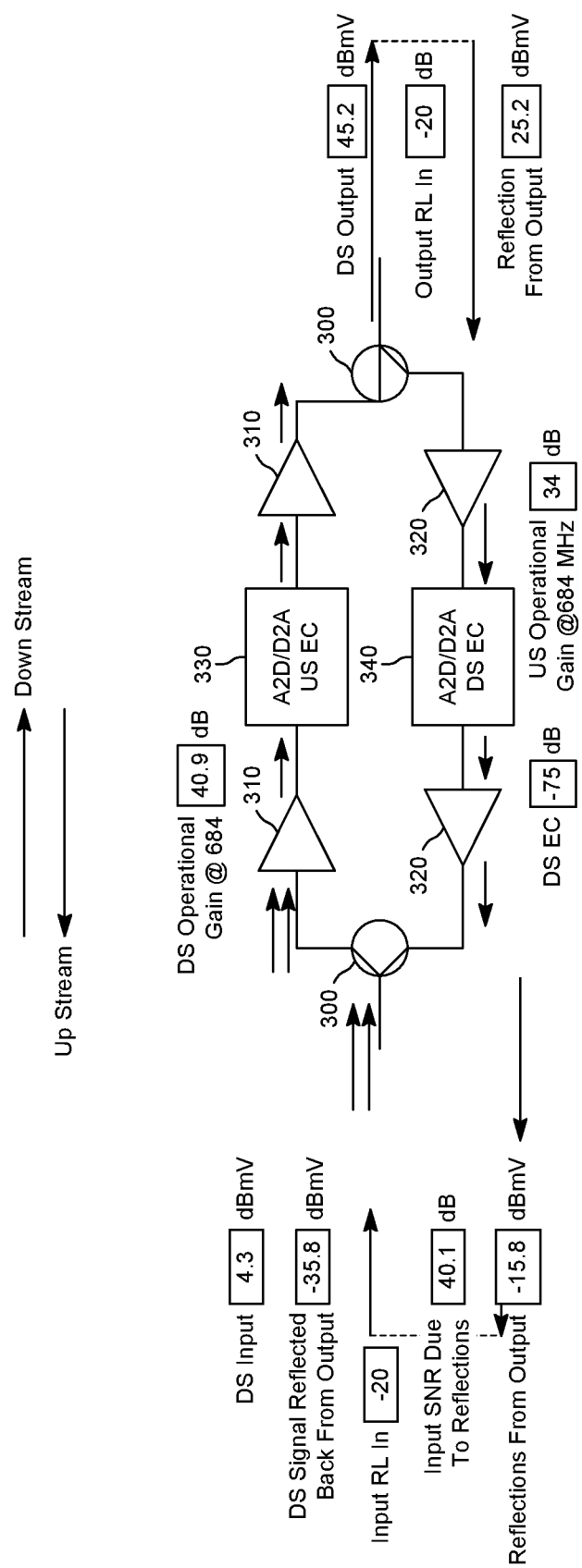
FIG. 3 illustrates a simplified block diagram of a full duplex amplifier with 75 dB echo cancellation.

Referring to FIG. 3, an amplifier having bi-directional amplification with echo cancellation is illustrated. The signals going from left to right are referred to as downstream signals. The signals going from right to left are referred to as upstream signals. The bi-directional amplifier may include filters 300 to separate the upstream and downstream frequency ranges while preferably supporting in at least some frequency range(s) with bidirectional communication. The bi-directional amplifier may include a set of downstream amplifiers 310 and upstream amplifiers 320. The bi-directional amplifier may include an analog to digital and digital to analog downstream processor with upstream echo cancellation 330. The bi-directional amplifier may include an analog to digital and a digital to analog upstream processor with downstream echo cancellation 340. In general, echo cancellation operates as follows, (1) a far end signal is delivered to the system, (2) the far end signal is reproduced, (3) the far end signal is filtered and delayed to resemble a near end signal, (4) the filtered far end signal is subtracted from the near end signal, and (5) the resulting signal has reduced noise as a result of the echo. The illustrated echo cancellation with the amplifier architecture leads to stringent demands on the amount of echo cancellation required by such an amplifier so that it will not oscillate due to re-reflections at the amplifier outputs. Further, such re-reflections cause substantial signal interference, even when the amplifier is not oscillating, that substantially degrade the overall system performance. By way of example, at 684 MHz, the operational gain for the downstream direction is 40.9 dB and 34 dB for the upstream direction. With 4.3 dBmV downstream input, the reflected back signal is −35.8 dBmV with the assumptions of 75 dB echo cancellation, and 20 dB return loss at both the input and output ports. Since this loop-back signal has gone through two analog-to-digital and digital-to-analog processes, it is a delayed version of its original signal, and is therefore treated as noise. The input signal-to-noise ratio due to the reflections in this case is only 40 dB even with 75 dB echo cancellation. As it may be observed, with such an amplifier architecture, the echo cancellation tends to include complex frequency analysis of the incoming and outgoing signals together with synthesis of signals to cancel the reflections based upon system training and correlation analysis.

Figure 4:
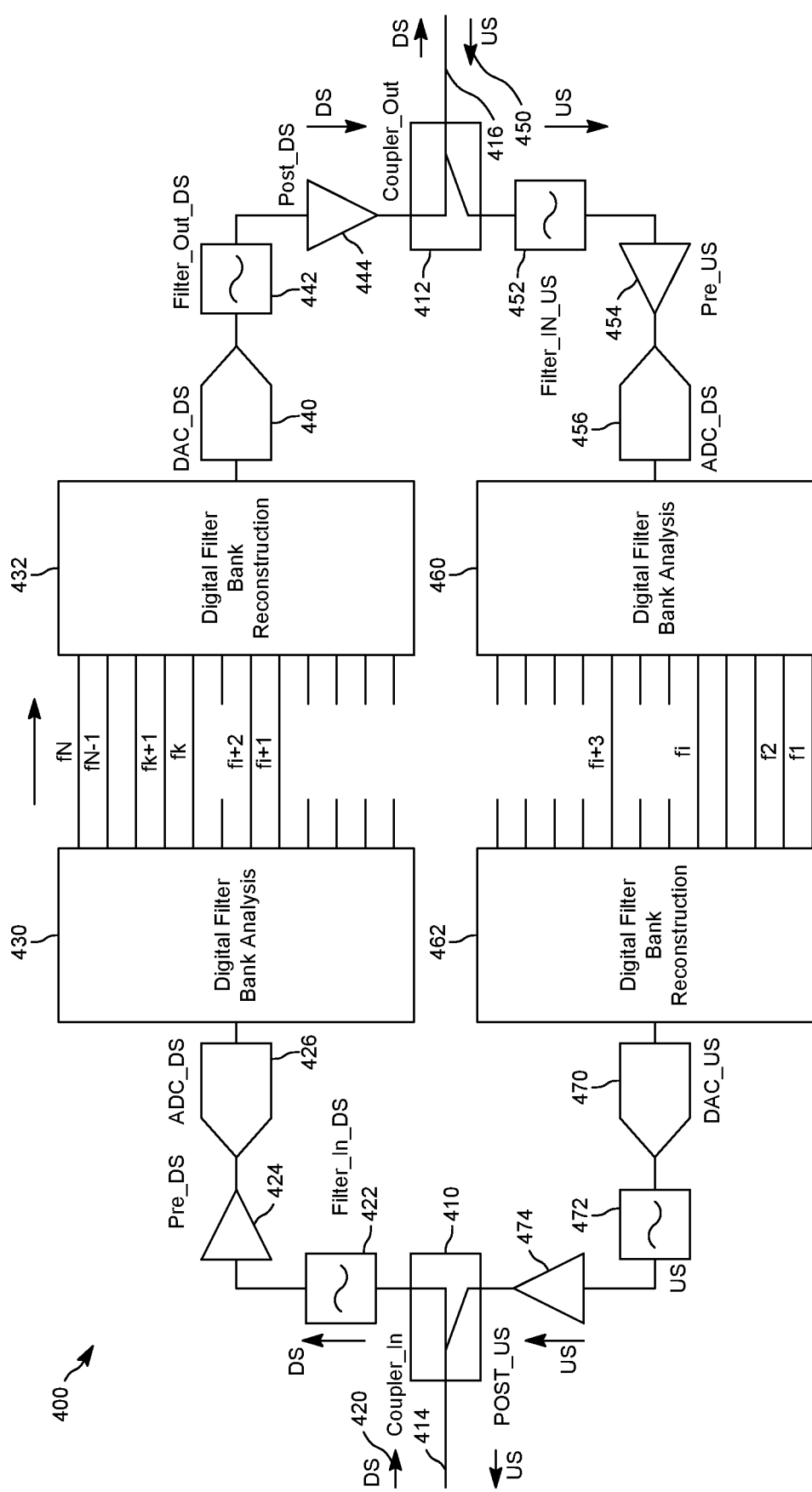
FIG. 4 illustrates an amplifier with digital filter banks with suppression of downstream traffic and/or upstream traffic in selected frequency bands.

Referring to FIG. 4, a modified bi-directional amplifier 400 may include an input coupler 410 and an output coupler 412. The input coupler 410 and output coupler 412 couple the downstream and upstream frequency signals for a respective co-axial cable 414, 416. A downstream signal 420 is split by the input coupler 410 and provided to a downstream input filter 422 which filters out frequencies not included within the downstream frequency range. The output of the downstream input filter 422 may be provided to a downstream pre-amplifier 424. The downstream pre-amplifier 424 preferably converts its input signal into an output signal strong enough for further processing. The combination of the downstream input filter 422 and the downstream pre-amplifier 424 conditions the signal levels and the signal spectrum (in the frequency domain) for conversion by an analog-to-digital converter. The output of the downstream pre-amplifier 424 is provided to a downstream analog to digital converter 426. The output of the downstream analog to digital converter 426 is provided to a downstream analysis digital filter bank 430 which provides signals to a downstream reconstruction digital filter bank 432, described in detail below.

The output of the downstream reconstruction digital filter bank 432 is provided to a downstream digital to analog converter 440. The downstream digital to analog converter 440 provides its output to a downstream output filter 442 which filters out frequencies not included within the downstream frequency range. The output of the downstream output filter 442 is provided to a downstream post-amplifier 444. The output of the downstream post-amplifier 444 is provided to the output coupler 412. If desired, the downstream output filter 442 may be used to add tilt (e.g., increase the levels of the higher frequencies with respect to the lower frequencies to compensate for losses at different frequencies due to transmission) to the output spectrum when a tilted output spectrum is desired from the amplifier. This permits the digital to analog converter to be operated with a flat spectrum, which improves its quantization noise performance.

An upstream signal 450 is split by the output coupler 412 and provided to an upstream input filter 452 which filters out frequencies not included within the upstream frequency range. The output of the upstream input filter 452 may be provided to an upstream pre-amplifier 454. The upstream pre-amplifier 454 preferably converts its input signal into an output signal strong enough for further processing. The combination of the upstream input filter 452 and the upstream pre-amplifier 454 conditions the signal levels and the signal spectrum (in the frequency domain) for conversion by an analog-to-digital converter. The output of the upstream pre-amplifier 454 is provided to an upstream analog to digital converter 456. The output of the upstream analog to digital converter 456 is provided to an upstream analysis digital filter bank 460 which provides signals to an upstream reconstruction digital filter bank 462, described in detail below.

The output of the upstream reconstruction digital filter bank 462 is provided to an upstream digital to analog converter 470. The upstream digital to analog converter 470 provides its output to an upstream output filter 472 which filters out frequencies not included within the upstream frequency range. The output of the upstream output filter 472 is provided to an upstream post-amplifier 474. The output of the upstream post-amplifier 474 is provided to the input coupler 410. If desired, the upstream output filter 472 may be used to add tilt (e.g., increase the levels of the higher frequencies with respect to the lower frequencies to compensate for losses at different frequencies due to transmission) to the output spectrum when a tilted output spectrum is desired from the amplifier. This permits the digital to analog converter to be operated with a flat spectrum, which improves its quantization noise performance.

The couplers, the filters, and/or the pre-amplifiers may be omitted or otherwise reconfigured, as desired. The downstream analysis digital filter bank 430 and the downstream reconstruction digital filter bank 432 may be reconfigured, as desired. The upstream analysis digital filter bank 460 and the upstream reconstruction digital filter bank 462 may be reconfigured, as desired. The downstream analysis digital filter bank 430 and the downstream reconstruction digital filter bank 432, may be combined, as desired. The upstream analysis digital filter bank 460 and the upstream reconstruction digital filter bank 462 may be combined, as desired. The downstream analysis digital filter bank 430, the downstream reconstruction digital filter bank 432, the upstream analysis digital filter bank 460, and the upstream reconstruction digital filter bank 462, may be combined, as desired.

The downstream analysis digital filter bank 430 performs a frequency analysis on the arriving digital signals. For example, the frequency analysis may be based upon a transform that includes a fast Fourier transform, a modulated lapped transform, or other suitable technique. After the frequency transform by the downstream analysis digital filter bank 430, the transform coefficients are a frequency domain representation of the incoming downstream signals. The downstream analysis digital filter bank 430 separates the signal into components representing the frequency content in the downstream signal at frequencies f1 to fN. The downstream signal at frequencies f1 to fN are provided to the downstream reconstruction digital filter bank 432 that reconstructs the signal from the information present in the separated components. Signal content at selected frequencies may be suppressed by not passing the signal information to the downstream reconstruction digital filter bank 432, such as for example, fi+3, f1 . . . fi. The result is the signals at selected suppressed frequencies are not provided as an output from the downstream reconstruction digital filter bank 432.

The upstream analysis digital filter bank 460 performs a frequency analysis on the arriving digital signals. For example, the frequency analysis may be based upon a transform that includes a fast Fourier transform, a modulated lapped transform, or other suitable technique. After the frequency transform by the upstream analysis digital filter bank 460, the transform coefficients are a frequency domain representation of the incoming upstream signals. The upstream analysis digital filter bank 460 separates the signal into components representing the frequency content in the downstream signal at frequencies f1 to fN. The upstream signal at frequencies f1 to fN are provided to the upstream reconstruction digital filter bank 462 that reconstructs the signal from the information present in the separated components. Signal content at selected frequencies may be suppressed by not passing the signal information to the upstream reconstruction digital filter bank 462, such as for example, fi+1, fi+2, fi+4 fN. By way of example, the suppression may be achieved for corresponding frequency bands by setting selected coefficients to zero, or substantially zero. The result is the signals at selected suppressed frequencies are not provided as an output from the upstream reconstruction digital filter bank 462.

As it may be observed, the combination of (1) the downstream analysis digital filter bank 430 and the downstream reconstruction digital filter bank 432, and (2) the upstream analysis digital filter bank 460 and the upstream reconstruction digital filter bank 462, preferably operate in such a manner that the frequencies that were suppressed in the downstream direction are not suppressed in the upstream direction, and the frequencies that were suppressed in the upstream direction are not suppressed in the downstream direction, at any particular point in time. In this manner, the likelihood of amplifier oscillation is reduced and re-reflections are likewise reduced. Also, the same frequencies may be suppressed in both the downstream direction and the upstream direction, if desired. In this manner, the amplifier provides gain to a selected set of signals in the downstream direction and the amplifier provides gain to a selected set of signals in the upstream direction.

The technique of a signal transform to frequency domain, suppression of certain frequency bands followed by inverse filtering, preferably using a technique that permits "perfect" reconstruction such as a lapped transform, in itself is equivalent to a filter operation with finite bandwidth, filter roll, and filter suppression. For example, if a downstream frequency band of 100-200 MHz is directly adjacent to an upstream frequency band of 200-300 MHz, then unintended downstream signal just above 200 MHz may still "leak" through the filter and amplifier chain due to imperfect suppression and if reflected, end up in the upstream direction. Such an unintended downstream signal could be a reflection of the original upstream signal, so that after the reflections and amplifications this signal interferes with itself and system degradation occurs. This results in a frequency band close to the crossover between upstream and downstream frequency bands (around 200 MHz in the example given) wherein system performance is degraded or may not be operational.

The attainable filter roll and suppression are thus parameters that may limit the frequency band(s) with degraded system performance. Fortunately, frequency transforms based on FFT methods (including lapped transforms) tend to be computationally efficient and result in a very high frequency resolution of their outputs. For example, between 10 and 100 kHz of resolution is feasible with reasonable computational effort. Whereas this resolution does not mean that perfect suppression is possible within such a small frequency range (adjacent frequency bands do not have perfect suppression), a high suppression can be reached within a few frequency bands and the range of the crossover can be limited to less than a 1 MHz or a 6 MHz channel. Thus, upstream and downstream frequency bands can be allocated close to each other without any significant loss of spectrum available to the system.

As it may be observed, this amplifier architecture does not rely on reflection cancellation requirements that are very challenging to meet and therefore is far less complex to operate. Furthermore, the amplifier architecture has improved characteristics since residual re-reflections (left over from imperfect reflection suppression) are no longer part of the amplifier architecture and, also the signal to noise degradation from reflection suppression signal processing is not present in the amplifier architecture. Accordingly, this particular amplifier architecture includes frequency sub-band analysis of upstream and downstream signals and signal reconstruction of upstream and downstream signals before amplification with suppression of frequency sub-bands in upstream and downstream spectra such that simultaneous amplification of signals in upstream and downstream direction does not occur at the same frequency.

Figure 5:
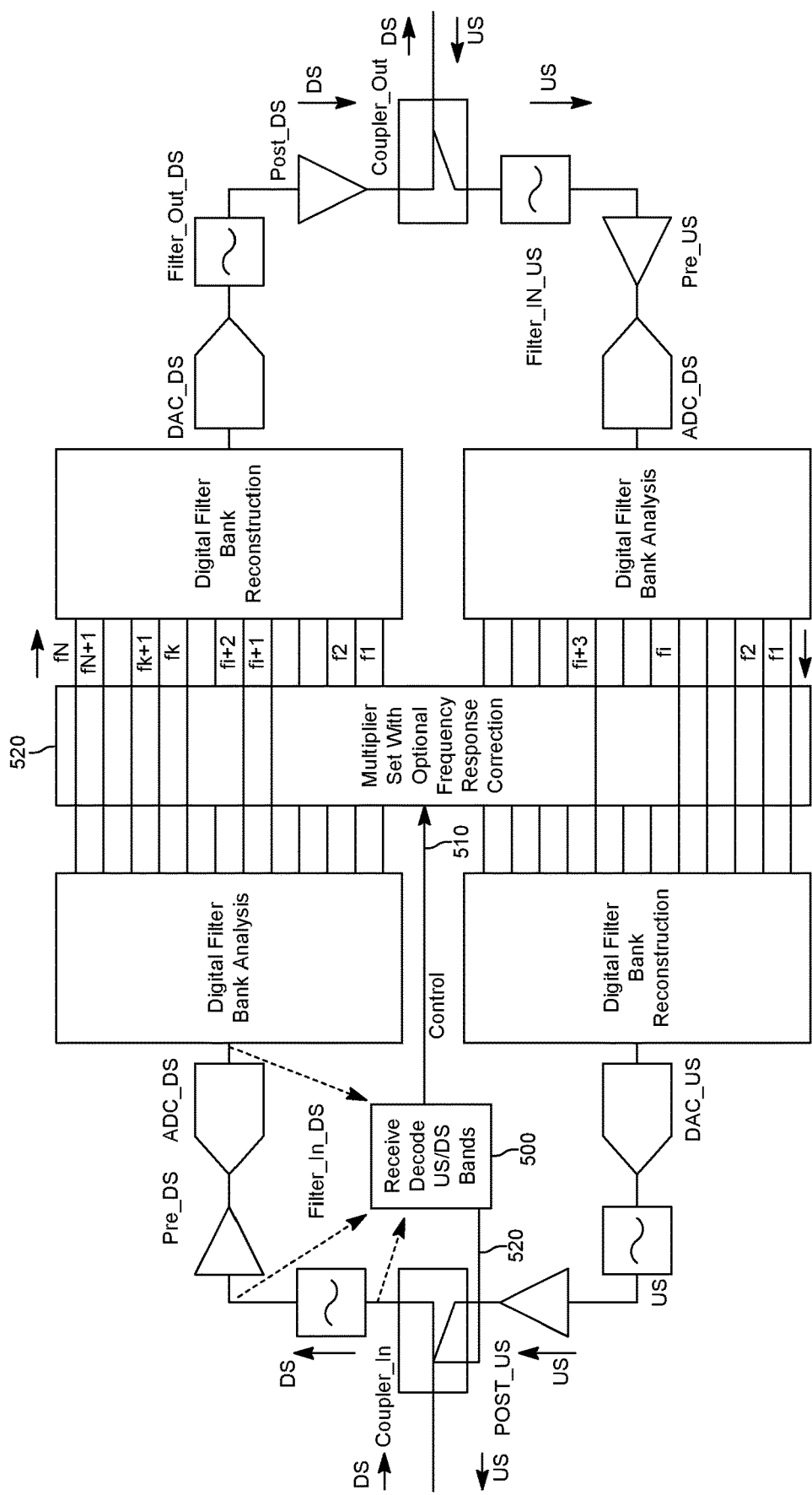
FIG. 5 illustrates an amplifier with digital filter banks with suppression of downstream traffic and/or upstream traffic in selected frequency bands together with a band controller.

Referring to FIG. 5, the amplifier may include a controller 500 that controls which frequency bands are amplified in a downstream direction and what frequency bands are amplified in an upstream direction. The controller 500 may provide a control signal 510 to a multiplier bank 520. The controller 500 may determine which frequency bands are to be enhanced (e.g., amplified) and/or attenuated, or otherwise receive a controller input 520, such as data within the upstream and/or downstream data indicating which frequency bands are to be amplified and in which directions. Alternately the amplifier may detect which frequency bands contain upstream and which frequency bands contain downstream signal input power to the amplifier and based on that have decision thresholds to enable upstream or downstream amplification in those frequency bands. One direction may have preference over the other direction so that in case of conflict such a direction, for instance downstream, is amplified whereas the other direction, for instance upstream is suppressed, in a frequency band in case signal power is detected in both directions. In a simplification, frequency band signal power may be detected in only one of the directions, such as downstream, and if signal power is present then that direction gets gain whereas the other direction is suppressed.

The controller 500 may receive a controller input signal 520 that may be transmitted in downstream direction and/or the upstream direction that is picked up along the radio frequency path at the input coupler 410, before and/or after filter and/or pre-amplification and/or after analog to digital conversion and/or in a selected frequency band after the digital filter operation. The controller input 520 may be decoded and used to control the gain of each frequency band in the downstream and/or in the upstream direction. As it may be observed, the downstream frequency bands and/or the upstream frequency bands may be dynamically modified to provide improved network management.

An amplifier that has received a control signal or detected a direction of operation in a frequency band may preferably signal that to a next amplifier in an amplifier chain so that the amplifier follows the operation of the first amplifier and does not need to go through its own decision process.

A system operated in this manner may observe guard bands around the crossover(s) between upstream and downstream frequency bands such that unwanted system degradation due to limited filter suppression in these crossover(s) is reduced.

Figure 6:
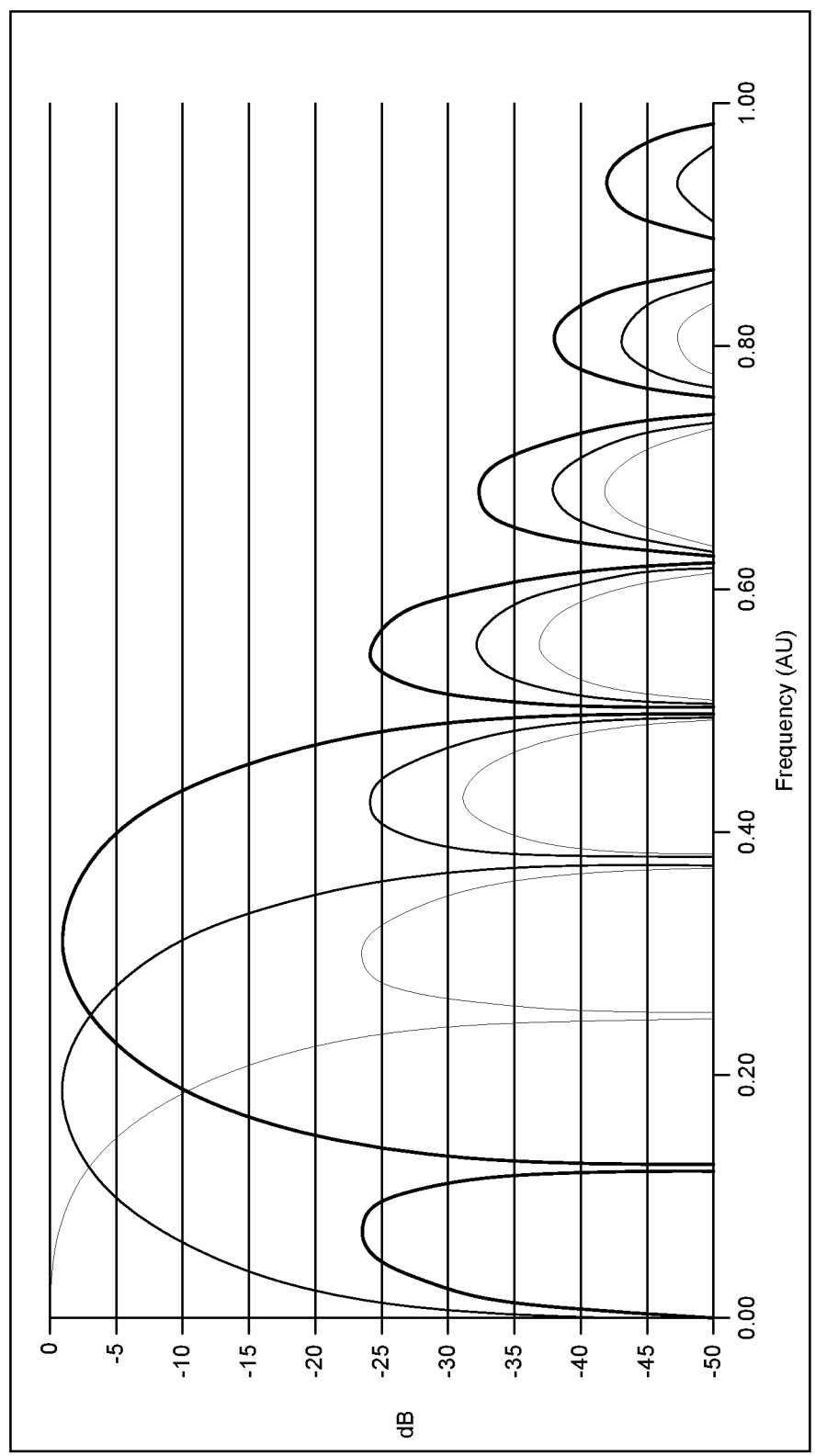
FIG. 6 illustrates digital filter responses as a function of frequency.
Figure 7:
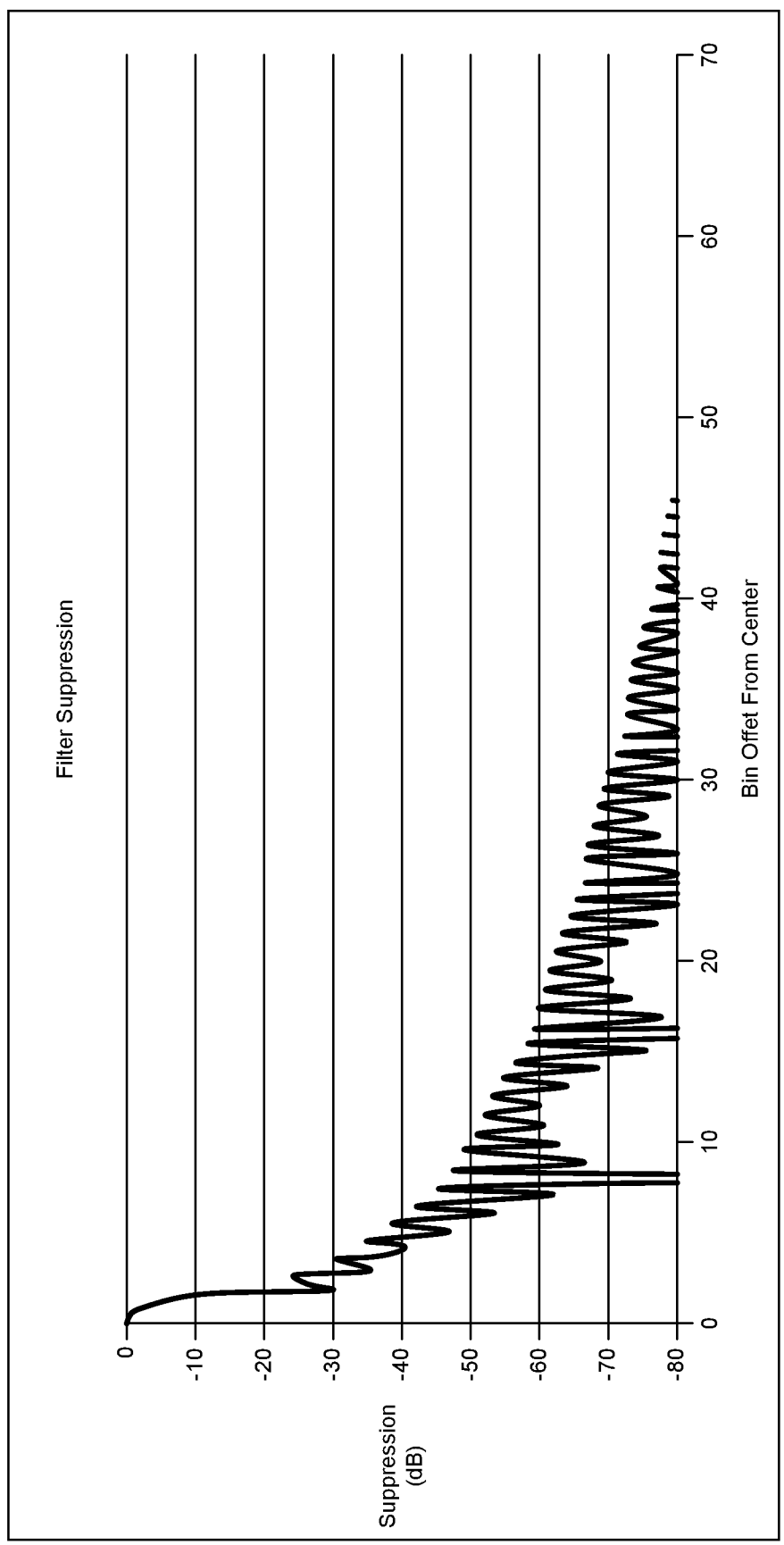
FIG. 7 illustrates a modulated lapped transform frequency response.

Referring to FIG. 6, an exemplary frequency response of three outputs of a digital bank is illustrated where adjacent filters do not have perfect separation from each other. Instead, adjacent filters responses overlap and some separation from the passband of a filter may be included to provide a given suppression. The separation may define a crossover band wherein communication is limited or not desirable. Also referring to FIG. 7, a transform-based filter example may include an offset of 30 bins where the filter response has decayed to −70 dB. The example may use a modulated lapped transform that has a matched inverse transform that has perfect reconstruction properties for a continuous arbitrary input signal. For example, with a 200 kHz bin width that is reasonable given the high implementation efficiency of transform-based filters, 70 dB suppression is reached at 6 MHz offset from the bin center. This translates to a loss of a single DOCSIS QAM channel in case the crossover band is not used for signaling. Even smaller bin widths may be used such that guard bands may be on the order of 1 MHz.

It is noted that an exemplary amplifier that does not include echo cancellation provides for an amplifier that is agnostic to the types of traffic that is being amplified. In contrast, an amplifier with deep echo cancellation is tuned to a particular type of data, such as DOCSIS 3.X data or DOCSIS 4.0 data. Furthermore, the amplifier may be reprogrammable using control data to relocate the location of the frequency bands and/or the size of each of the frequency bands such that bidirectional frequency bands and unidirectional frequency bands can be assigned, as needed.

Figure 8:
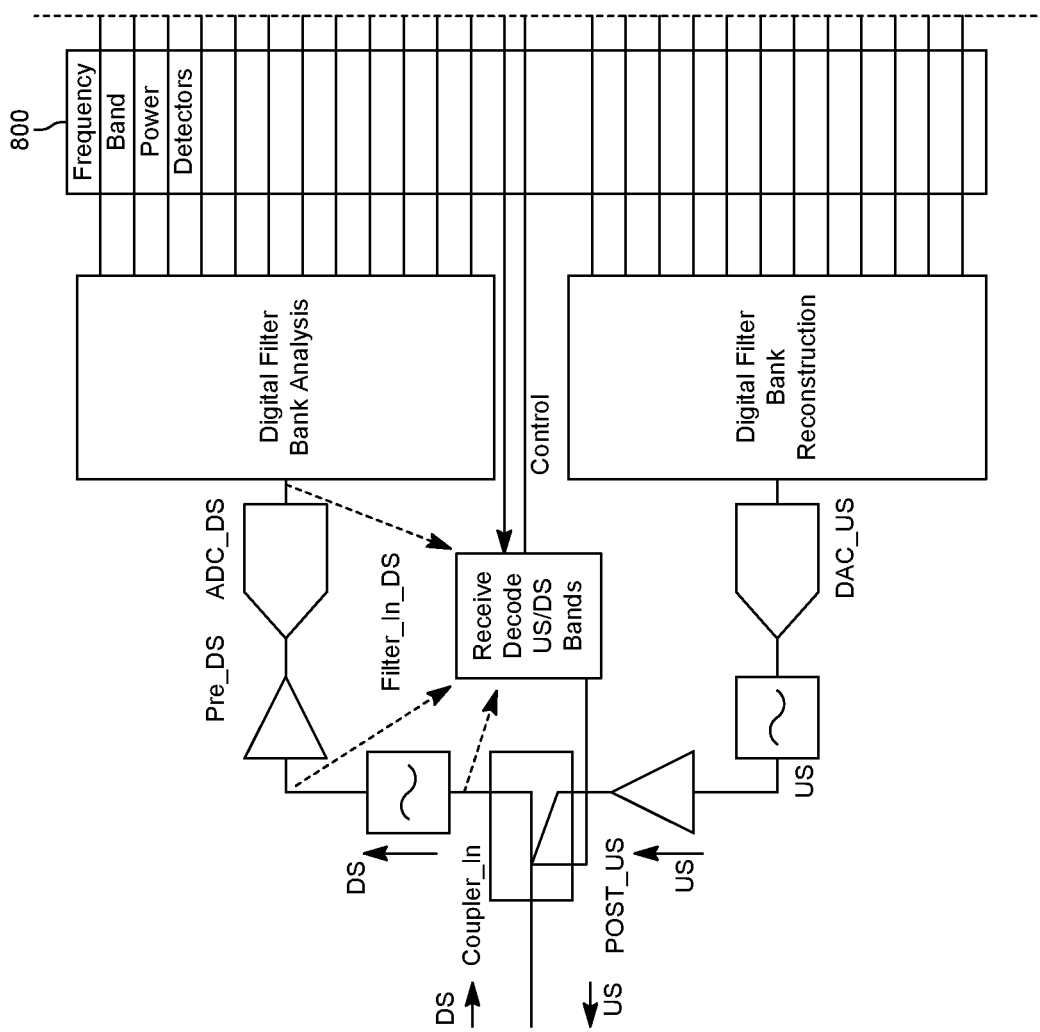
FIG. 8 illustrates an amplifier with digital filter banks with suppression of downstream traffic and/or upstream traffic in selected frequency bands together with a band controller and power modification.
Figure 8:
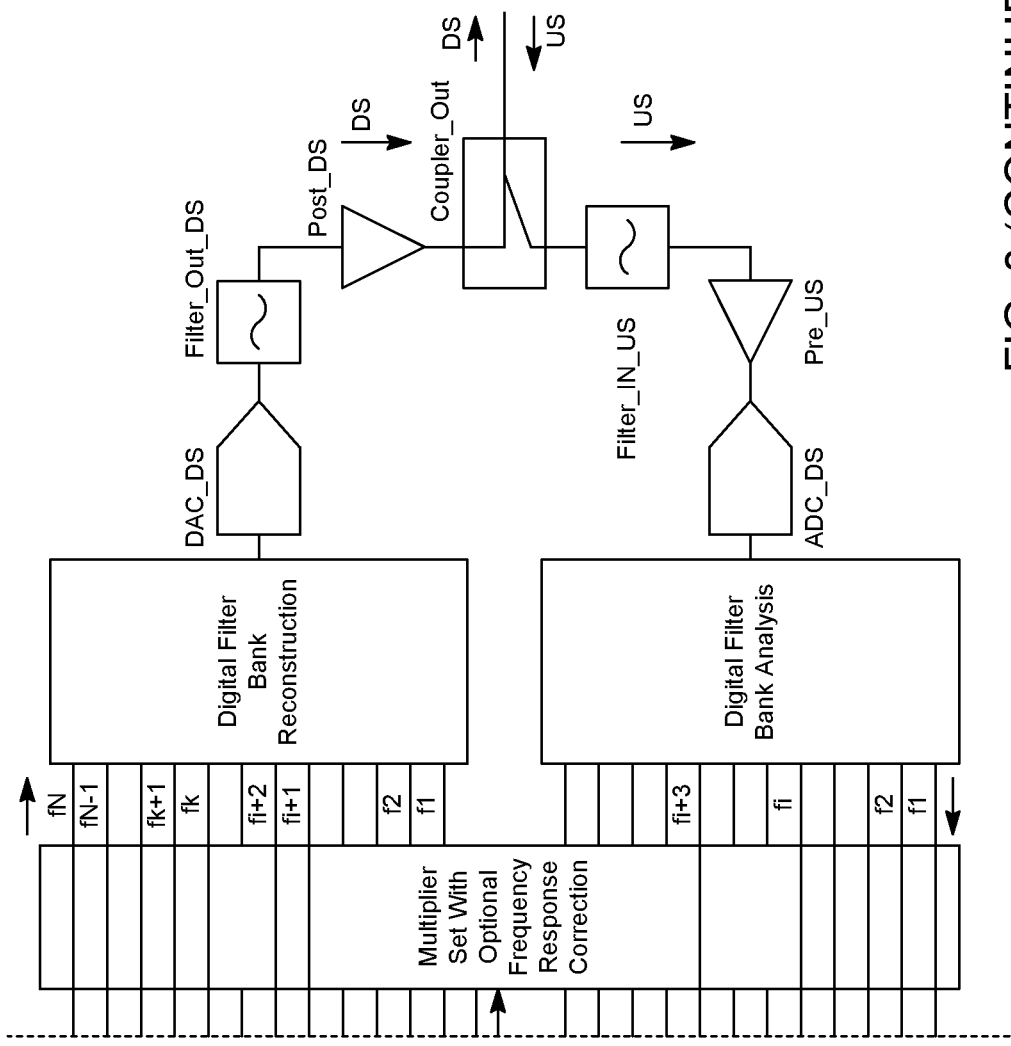

Referring to FIG. 8, in the guard bands the gain may be altogether suppressed, or it may be reduced by choosing an appropriate multiplication factor for the sub-bands in the crossover region. Furthermore, a system operated with a (optionally transform based) digital filter bank may apply multiplication factors to sub-bands to perform a frequency correction to an amplifier response where these factors may be different in the forward direction and the reverse direction. A system operated in this manner may use frequency band power detectors 800 to detect average power in any part of the frequency spectrum and apply such a frequency correction to obtain a desired average frequency output power spectrum at the amplifier outputs. This way such a system may automatically correct for drift in system losses and RF amplifier gain both in terms of overall gain and in terms of frequency response (such as cable tilt or amplifier tilt correction).

Figure 9:
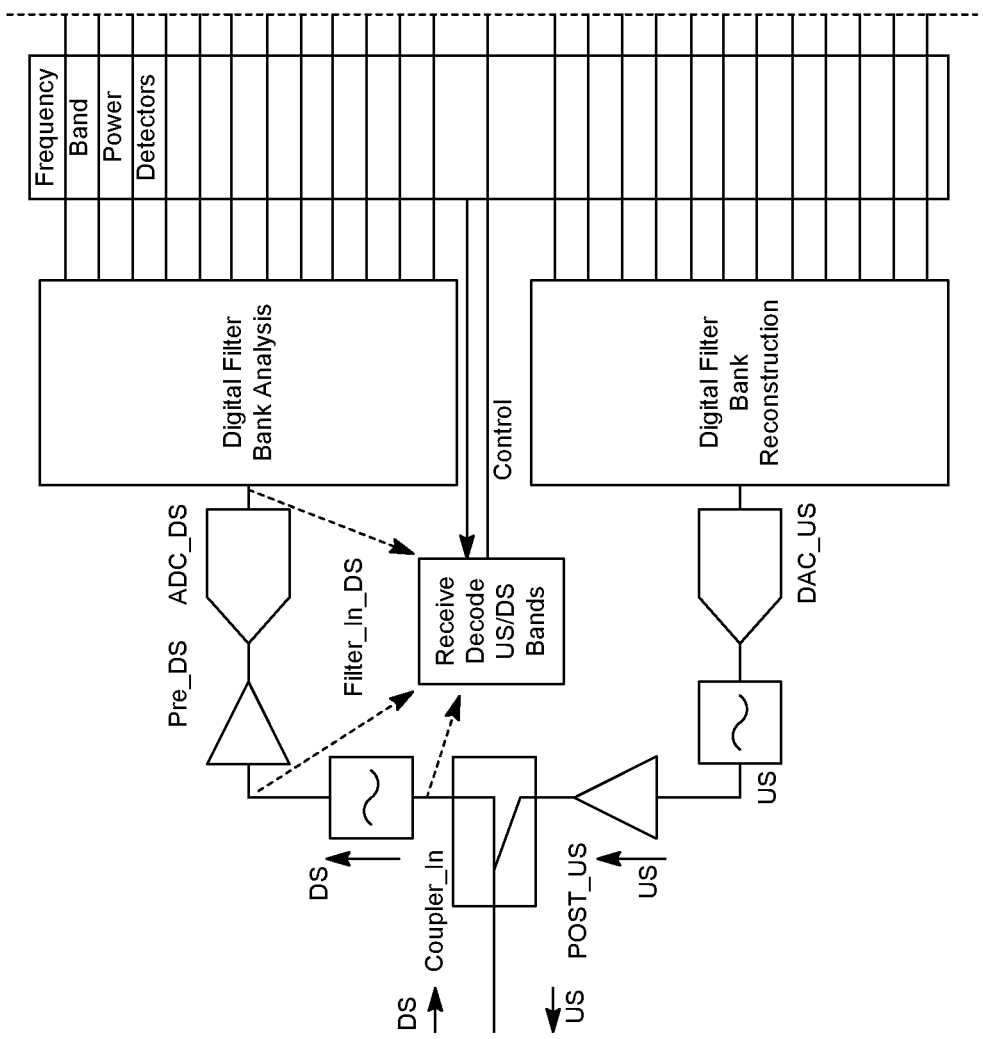
FIG. 9 illustrates an amplifier with digital filter banks with suppression of downstream traffic and/or upstream traffic in selected frequency bands together with a band controller, power modification, and shifting frequency bands.
Figure 9:
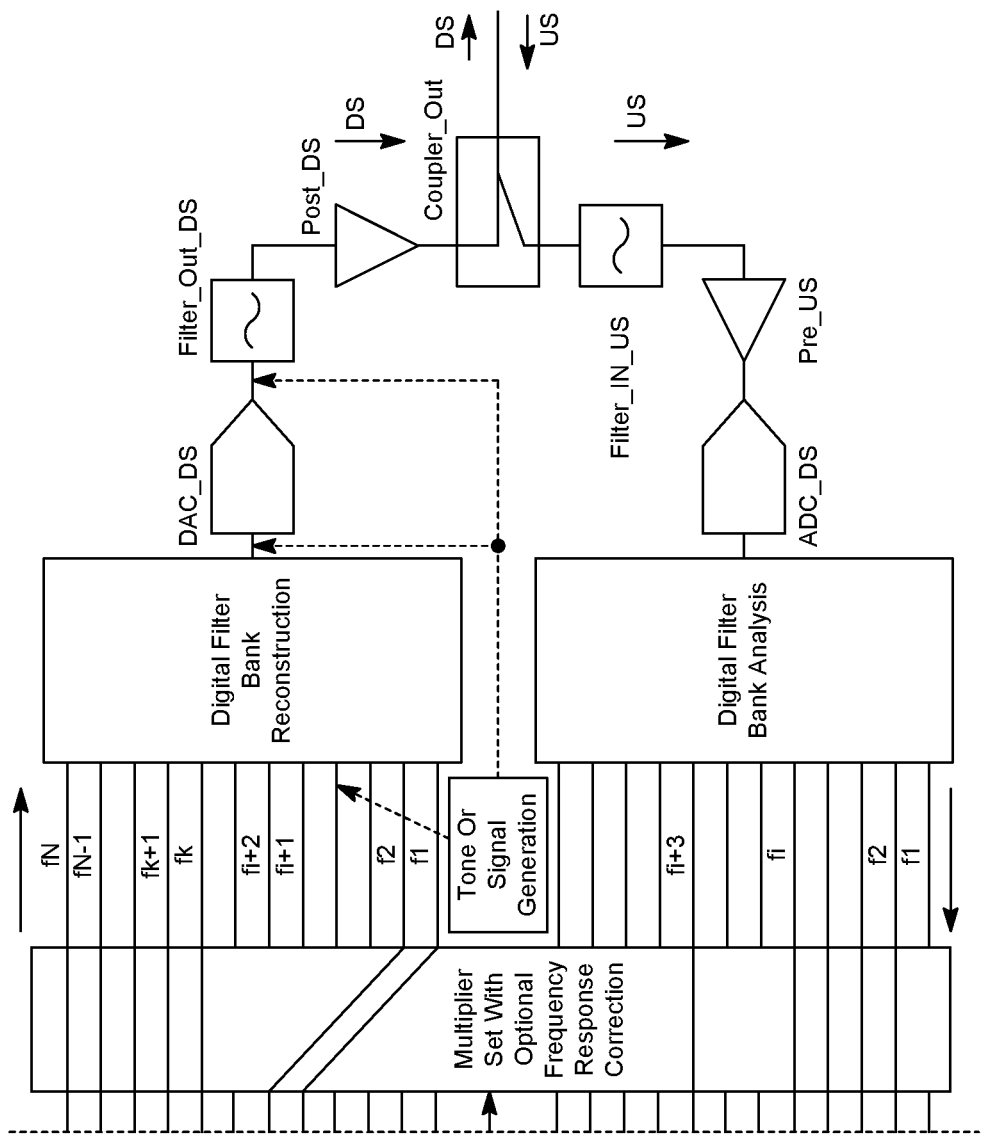

Referring to FIG. 9, a portion of the spectrum may be still lost due to the crossover region(s) in the digital filtering process, which is preferably recovered. One manner of recovering a portion of the spectrum is that information in a part of the spectrum (e.g., 199-201 MHz for a crossover around 200 MHz), may be shifted to another frequency band (e.g., 99-101 MHz) in the case that frequency band was previously unused at a particular time. When a transform is used for frequency analysis combined with inverse transform for signal reconstruction, where the sub-bands after the transform represent the frequency spectrum, then it is computationally efficient to take sub-bands representing one frequency range (for instance 199-201 MHz) and move them to sub-bands representing another frequency band (for instance 99-101 MHz) for inverse transform. As a consequence, after inverse transform, that information is then put out at that the other frequency band (for instance 99-101 MHz). At a receiving end where the information is used, the information may be shifted to the original frequency band (199-201 MHz) by the inverse operation. This is particularly true when using transform based digital filtering.

As illustrated in FIG. 9, for example, the downstream signals at frequencies $f_i+1$ and $f_i+2$ are shifted down to frequencies $f_1$ and $f_2$. In the example $f_1$ and $f_2$ are not used for upstream signals.

For processing wherein a frequency band is shifted at a first amplifier location and then shifted back at another amplifier location, it may be preferable to operate the digital signal processing such that the transformations occur in a synchronous clock domain to reduce reconstruction errors. To that end it may be desirable to inject a clock synchronization signal in the amplifier chain that synchronizes data conversions and digital signal processing operations. That signal may be generated in the first amplifier of the signal chain and sent in downstream direction or in the node connected to that amplifier. It may be injected at one or more frequencies in the digital filter, after the digital filter or generated in the RF domain and injected after a digital to analog converter. However, such a signal may also be generated in the last amplifier of an amplifier chain and sent in upstream direction. Each amplifier may detect the presence of that signal and in case it is not present, generate its own signal (thus becoming the "master" that is followed by subsequent amplifiers). Such a signal may be a dual-purpose signal, also used to encode the current direction of frequency bands in upstream and downstream directions. There may be more than one such signals where the signals are also used as pilot tones used to automatically detect amplifier gain, cable plant loss, and loss tilt such that a frequency and gain correction may be applied to counter this.

Using a transform based digital filter with "perfect" reconstruction properties such as a modulated lapped transform has the benefit of being able to operate with arbitrary input and output signals, so it is not dependent on modulation formats and therefore can operate in a system with mixed QAM and OFDM channels. This enables a migration path for cable network operators that may see a limited amount of OFDM in their systems in the near future, but will migrate to mostly OFDM based DOCSIS in the long term. The amplifier described herein may make any frequency band available for downstream traffic or upstream traffic, and those selected frequency bands can be assigned static to operate with legacy systems and dynamic to operate with frequency division duplexing systems. By way of example, frequency bands may continue to be assigned to legacy modems for as long as these are present in the system and assigned to frequency division duplexing operation as frequencies are freed up when legacy modems are phased out. Other transform-based filters may be used, as desired.

Figure 10:
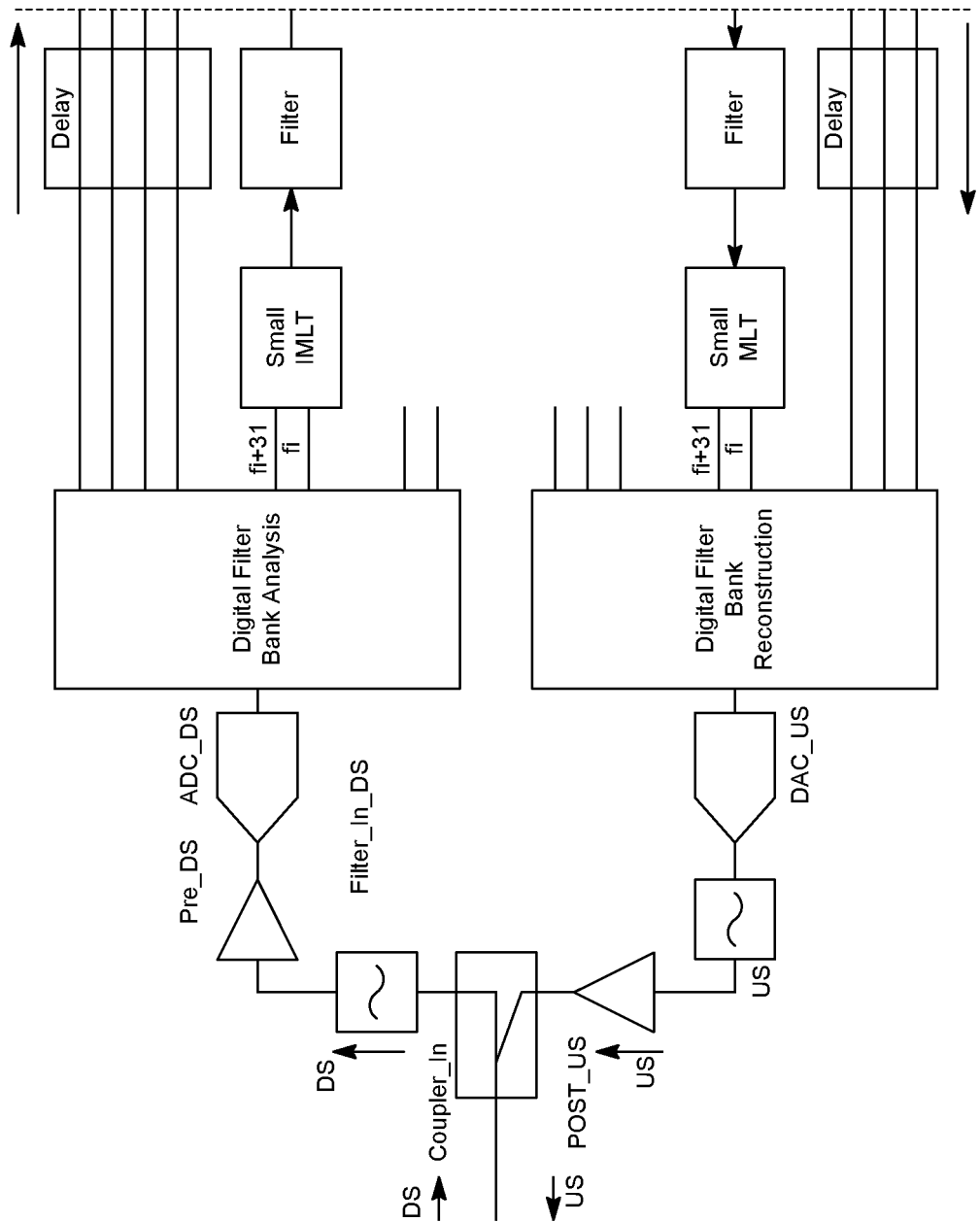
FIG. 10 illustrates an amplifier with digital filter banks with suppression of downstream traffic and/or upstream traffic in selected frequency bands together with a band controller, power modification, and shifting frequency bands with additional filtering.
Figure 10:
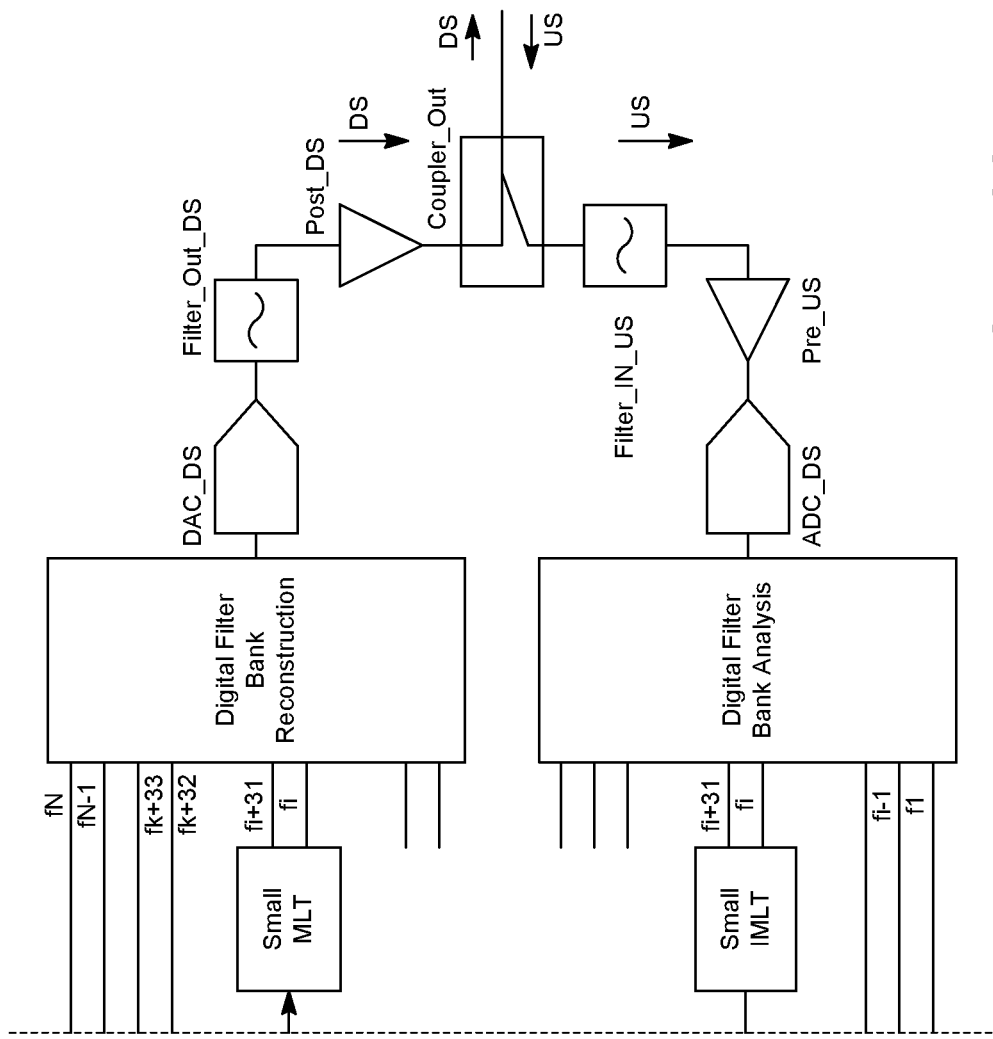

Referring to FIG. 10, the crossover band of the modulated lapped transform based filter banks present a loss of some usable frequencies. In the case that many crossovers are present in the system that loss may add up, for instance in case a lot of downstream frequency bands and upstream frequency bands are inter-spaced. It is therefore desirable to operate such a system with a limited number of such crossovers, for instance one, where the downstream and the upstream direction change.

With one or a limited number of crossovers, the loss of available frequency spectrum is relatively small. However, it may be desirable to even further reduce the loss of available frequency spectrum. The further reduction may be achieved by recognizing that high frequency resolution (e.g., a sharp filter characteristic) is needed at only one (or a limited number of) crossover bands. The performance of the filter bank may be enhanced at the crossover(s) by making some use a modulated lapped transform(s) (or other appropriate filter bank(s)). Output signals of the input modulated lapped transform in the crossover frequency range, for instance 32 bins, may be selected and injected into an inverse (I) modulated lapped transform at a shifted frequency range, for instance starting at 0 Hz. This results in a signal with those frequencies being put out starting at 0 Hz. A small inverse modulated lapped transform with only 32 bins is typically sufficient to reconstruct that signal and that may then be injected into a digital filter with a very sharp crossover. That signal is then provided to a same small sized modulated lapped transform and the resulting 32 bins are injected into the inverse modulated lapped transform at the original crossover frequency bins. The overall performance then has a much sharper crossover. The filter operation to obtain such a sharp crossover will have a delay, and the other frequencies are preferably delayed by the same amount. This amplifier configuration makes use of multiple different filters for different portions of the frequency range.

The combination of small inverse modulated lapped transform/filter/modulated lapped transform can be implemented in any manner, for example, the filter may be a finite impulse response filter or in-itself be a transform-based filter.

In another embodiment, a larger size modulated lapped transform may be used in all operations such that high frequency resolution is obtained across the band. This results in a modest increase in computation effort with additional memory requirements.

Figure 11:
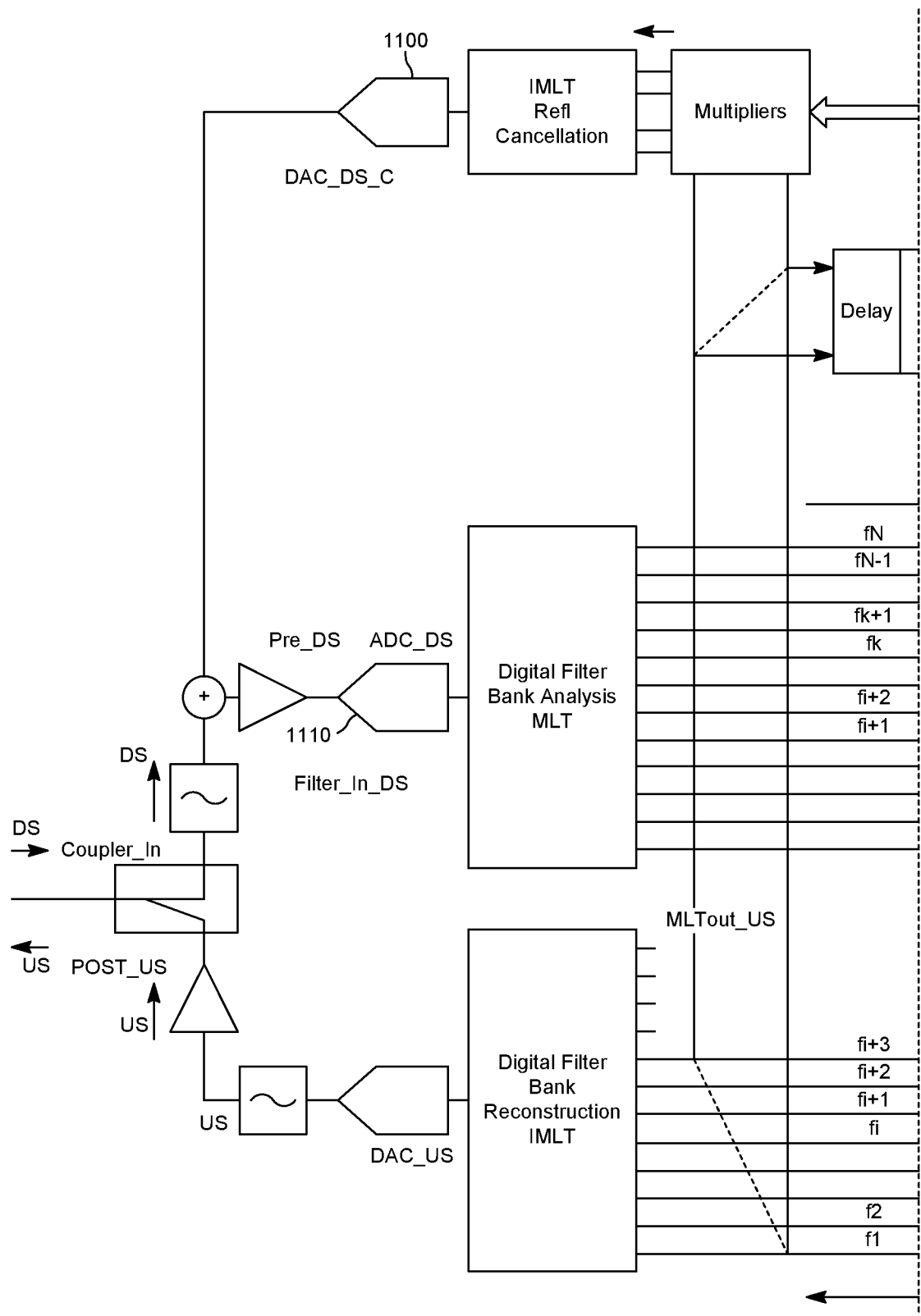
FIG. 11 illustrates an amplifier with digital filter banks with suppression of downstream traffic and/or upstream traffic in selected frequency bands together with a band controller, power modification, and shifting frequency bands with reflection cancellation.
Figure 11:
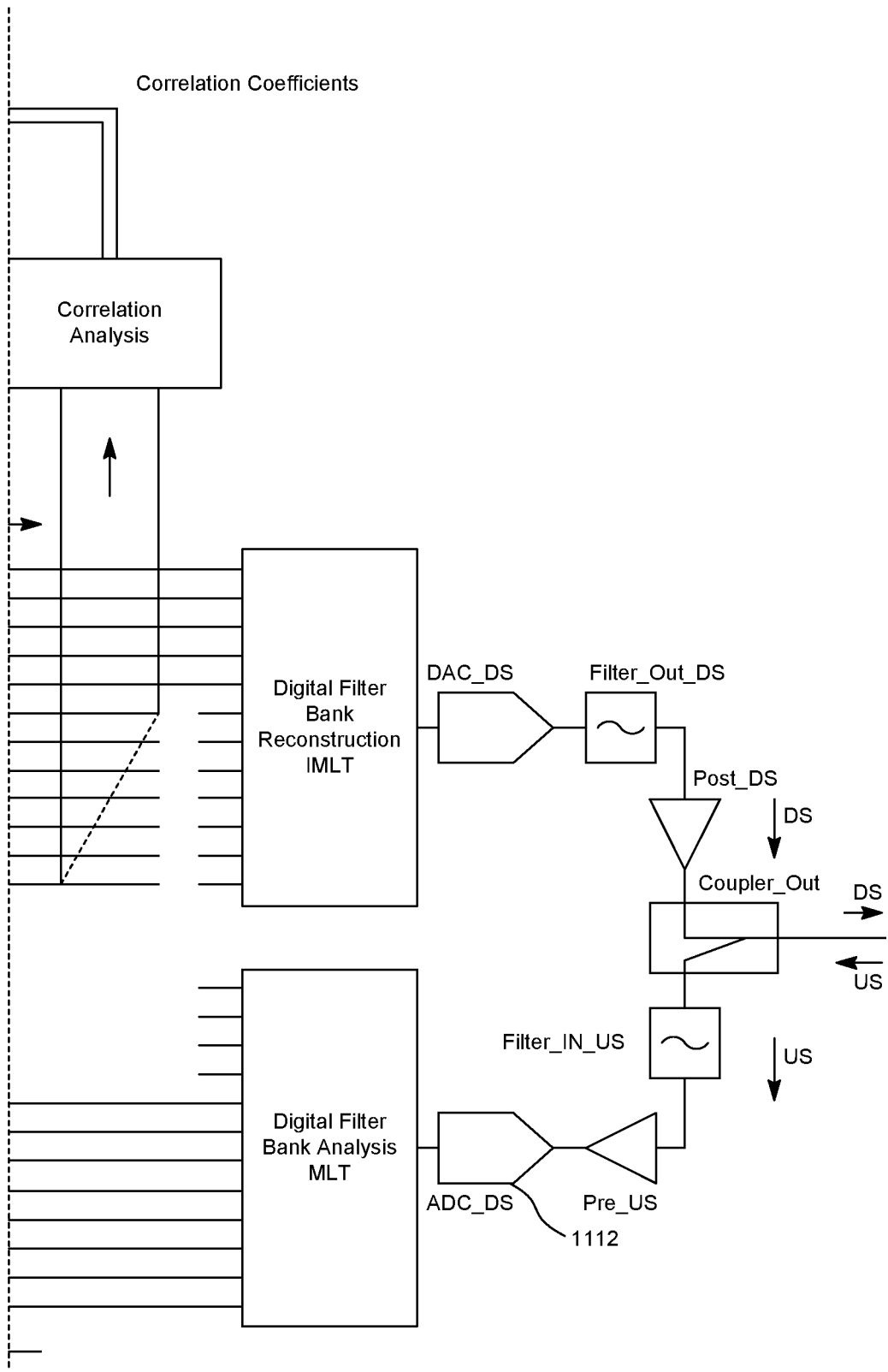

Referring to FIG. 11, in the case that analog reflection cancellation is desired together with the amplifier, it may be implemented using one or more additional digital to analog converters, for instance DAC_DS_C 1100 can inject a signal into one of the analog to digital converter paths in this system, for instance ADC_DS 1110, to reduce reflections of signals that were put out by the analog to digital converters, for instance DAC_US 1112. FIG. 11 illustrates an example with such a DAC implemented in the downstream path but in general such a DAC may be implemented at each of the ADCs included in the system. In case only limited reflection cancellation is needed, such as less than 20 dB, it can be beneficial to choose a minimum modulated lapped transform size such that the reflection is largely captured by a single modulated lapped transform, considering the signal duration handled by that transform. For instance, if the maximum reflection roundtrip time is 500 ns, the transform may be designed such that each transform captures a 5 us overlapping window of input signal. That means that the reflection is largely captured within a single transform captured by the analog to digital converter and correlation analysis of this single transform to the transform of the signal put out on the digital to analog converter that caused this reflection is sufficient to capture a good approximation of that reflection. The transform of any signal put out (for instance MLTout_US) is available in the system before the inverse modulated lapped transform, so apart from delays the information to be correlated is already present. Once the correlation analysis is done then correlation coefficients can be applied to the signals put out by DAC_DS_C 1100 after an additional inverse modulated lapped transform that generates the reflection cancellation signal.

The example of FIG. 11, exemplifies upstream signals interfering with the downstream path, but the technique may be equally well applied to downstream signals interfering with the upstream path.

The example transform size of 5 us results in a multiple thereof in terms of system processing delay, for instance 3-4 times so that the total delay is around 20 us, equivalent to 4 km of fiber or 6 km of hard line in the network system. This uses a portion of the DOCSIS delay budget of 160 km but is not prohibitive.

It is noted that the input and/or output may be provided through other communication mediums other than coaxial cables. It is noted that the amplifier may be used in other environments, other than a cable network.

Moreover, each functional block or various features in each of the aforementioned embodiments may be implemented or executed by a circuitry, which is typically an integrated circuit or a plurality of integrated circuits. The circuitry designed to execute the functions described in the present specification may comprise a general-purpose processor, a digital signal processor (DSP), an application specific or general application integrated circuit (ASIC), a field programmable gate array (FPGA), or other programmable logic devices, discrete gates or transistor logic, or a discrete hardware component, or a combination thereof. The general-purpose processor may be a microprocessor, or alternatively, the processor may be a conventional processor, a controller, a microcontroller or a state machine. The general-purpose processor or each circuit described above may be configured by a digital circuit or may be configured by an analogue circuit. Further, when a technology of making into an integrated circuit superseding integrated circuits at the present time appears due to advancement of a semiconductor technology, the integrated circuit by this technology is also able to be used.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

We claim:

1. An amplifier for a cable network comprising:
   (a) said amplifier receiving a downstream analog input signal having a frequency spectrum from an input coaxial cable;
   (b) said amplifier converting said frequency spectrum of said downstream analog input signal to a downstream digital input signal, selectively modifying selected frequencies of said downstream digital input signal, converting said modified downstream digital input signal to a downstream analog output signal, and providing said downstream analog output signal to an output coaxial cable for a customer;
   (c) said amplifier receiving an upstream analog input signal having a frequency spectrum from said output coaxial cable;
   (d) said amplifier converting said frequency spectrum of said upstream analog input signal to an upstream digital input signal, selectively modifying selected frequencies of said upstream digital input signal, converting said modified upstream digital input signal to an upstream analog output signal, and providing said upstream analog output signal to said input coaxial cable;

(e) wherein said amplifier is free from simultaneously providing said upstream analog output signal having a frequency range that is overlapping with said downstream analog output signal;

(f) wherein the frequency range of said downstream analog output signal is adjustable by said amplifier;

(g) wherein the frequency range of said upstream analog output signal is adjustable by said amplifier;

(h) wherein said frequency range of said downstream analog output signal is overlapping with said frequency range of said upstream analog output signal;

(i) wherein said downstream analog output signal and said upstream analog output signal do not provide a respective output signal at both the same time and at the same frequency;

(j) wherein said amplifier attenuates signals in a guard band in (1) said overlapping frequency range and (2) one of said frequency range of said downstream analog output signal and said frequency range of said downstream analog output signal.

2. An amplifier for a cable network comprising:
(a) said amplifier receiving a downstream analog input signal having a frequency spectrum from an input coaxial cable;
(b) said amplifier converting said frequency spectrum of said downstream analog input signal to a downstream digital input signal, selectively modifying selected frequencies of said downstream digital input signal, converting said modified downstream digital input signal to a downstream analog output signal, and providing said downstream analog output signal to an output coaxial cable for a customer;
(c) said amplifier receiving an upstream analog input signal having a frequency spectrum from said output coaxial cable;
(d) said amplifier converting said frequency spectrum of said upstream analog input signal to an upstream digital input signal, selectively modifying selected frequencies of said upstream digital input signal, converting said modified upstream digital input signal to an upstream analog output signal, and providing said upstream analog output signal to said input coaxial cable;
(e) wherein said amplifier is free from simultaneously providing said upstream analog output signal having a frequency range that is overlapping with said downstream analog output signal;
(f) wherein the frequency range of said downstream analog output signal is adjustable by said amplifier;
(g) wherein the frequency range of said upstream analog output signal is adjustable by said amplifier;
(h) wherein said frequency range of said downstream analog output signal is overlapping with said frequency range of said upstream analog output signal;
(i) wherein said downstream analog output signal and said upstream analog output signal do not provide a respective output signal at both the same time and at the same frequency;
(j) wherein said amplifier attenuates signals in a guard band between a frequency of said downstream analog output signal and a frequency of said upstream analog output signal.

3. An amplifier for a cable network comprising:
(a) said amplifier receiving a downstream analog input signal having a frequency spectrum from an input coaxial cable;
(b) said amplifier converting said frequency spectrum of said downstream analog input signal to a downstream digital input signal, selectively modifying selected frequencies of said downstream digital input signal, converting said modified downstream digital input signal to a downstream analog output signal, and providing said downstream analog output signal to an output coaxial cable for a customer;
(c) said amplifier receiving an upstream analog input signal having a frequency spectrum from said output coaxial cable;
(d) said amplifier converting said frequency spectrum of said upstream analog input signal to an upstream digital input signal, selectively modifying selected frequencies of said upstream digital input signal, converting said modified upstream digital input signal to an upstream analog output signal, and providing said upstream analog output signal to said input coaxial cable;
(e) wherein said amplifier is free from simultaneously providing said upstream analog output signal having a frequency range that is overlapping with said downstream analog output signal;
(f) wherein the frequency range of said downstream analog output signal is adjustable by said amplifier;
(g) wherein the frequency range of said upstream analog output signal is adjustable by said amplifier;
(h) wherein said frequency range of said downstream analog output signal is overlapping with said frequency range of said upstream analog output signal;
(i) wherein said downstream analog output signal and said upstream analog output signal do not provide a respective output signal at both the same time and at the same frequency;
(j) wherein at least one of (1) a frequency band of said downstream analog input signal is shifted to a different frequency band of said downstream analog output signal, and (2) a frequency band of said upstream analog input signal is shifted to a different frequency band of said upstream analog output signal.

4. The amplifier of claim 3 further comprising providing a clock synchronization signal from said amplifier to another amplifier.

5. The amplifier of claim 3 further comprising providing a pilot tones from said amplifier to another amplifier.

6. An amplifier for a cable network comprising:
(a) said amplifier receiving a downstream analog input signal having a frequency spectrum from an input coaxial cable;
(b) said amplifier converting said frequency spectrum of said downstream analog input signal to a downstream digital input signal, selectively modifying selected frequencies of said downstream digital input signal, converting said modified downstream digital input signal to a downstream analog output signal, and providing said downstream analog output signal to an output coaxial cable for a customer;
(c) said amplifier receiving an upstream analog input signal having a frequency spectrum from said output coaxial cable;
(d) said amplifier converting said frequency spectrum of said upstream analog input signal to an upstream digital input signal, selectively modifying selected frequencies of said upstream digital input signal, converting said modified upstream digital input signal to an upstream analog output signal, and providing said upstream analog output signal to said input coaxial cable;

(e) wherein said amplifier is free from simultaneously providing said upstream analog output signal having a frequency range that is overlapping with said downstream analog output signal;

(f) wherein the frequency range of said downstream analog output signal is adjustable by said amplifier;

(g) wherein the frequency range of said upstream analog output signal is adjustable by said amplifier;

(h) wherein said frequency range of said downstream analog output signal is overlapping with said frequency range of said upstream analog output signal;

(i) wherein said downstream analog output signal and said upstream analog output signal do not provide a respective output signal at both the same time and at the same frequency;

(j) wherein at least one of (1) said converting said frequency spectrum of said downstream analog input signal to a downstream digital input signal, and (2) said converting said modified downstream digital input signal to a downstream analog output signal, includes a first converting with a first filter having a first sharpness for a first frequency range and a second converting with a second filter having a second sharpness for a second frequency range, wherein the second sharpness is greater than said first sharpness.

* * * * *